United States Patent [19]
Engelmann et al.

[11] Patent Number: 6,127,830
[45] Date of Patent: Oct. 3, 2000

[54] PROCESS AND CIRCUITRY FOR MONITORING A CONTROL CIRCUIT

[75] Inventors: Mario Engelmann, Steinbach; Michael Zydek, Langgöns; Olaf Zinke, Hofheim; Wolfgang Fey, Niedernhausen, all of Germany

[73] Assignee: ITT Manufacturing Enterprises, Inc., Wilmington, Del.

[21] Appl. No.: 09/029,006

[22] PCT Filed: Jun. 20, 1996

[86] PCT No.: PCT/EP96/02689

§ 371 Date: Sep. 21, 1998

§ 102(e) Date: Sep. 21, 1998

[87] PCT Pub. No.: WO97/06039

PCT Pub. Date: Feb. 20, 1997

[30] Foreign Application Priority Data

Aug. 10, 1995 [DE] Germany .................. 195 29 433

[51] Int. Cl.[7] .................................................. G01R 27/14
[52] U.S. Cl. ........................ 324/713; 324/768; 324/769
[58] Field of Search ............................ 324/71.1, 546, 324/654, 713

[56] References Cited

U.S. PATENT DOCUMENTS

| | | | |
|---|---|---|---|
| 3,911,392 | 10/1975 | Fleagle | 340/52 B |
| 4,661,910 | 4/1987 | Reineckle et al. | 364/426 |
| 4,703,388 | 10/1987 | Ruhnau | 361/91 |
| 5,221,905 | 6/1993 | Bhangu et al. | 324/713 |
| 5,557,197 | 9/1996 | Schulze et al. | 324/115 |

FOREIGN PATENT DOCUMENTS

| | | |
|---|---|---|
| 0415039 | 3/1991 | European Pat. Off. . |
| 3730503 | 3/1989 | Germany . |
| 3904441 | 8/1990 | Germany . |
| 3928651 | 3/1991 | Germany . |
| 4012353 | 10/1991 | Germany . |
| 4013997 | 11/1991 | Germany . |
| 4020094 | 1/1992 | Germany . |
| 4024496 | 2/1992 | Germany . |
| 4024905 | 2/1992 | Germany . |
| 4036521 | 5/1992 | Germany . |
| 4125302 | 2/1993 | Germany . |
| 4201577 | 7/1993 | Germany . |
| 4140586 | 1/1994 | Germany . |
| 4224266 | 3/1994 | Germany . |
| WO 92/17358 | 10/1992 | WIPO . |

*Primary Examiner*—Safet Metjahic
*Assistant Examiner*—Vincent Q. Nguyen
*Attorney, Agent, or Firm*—Rader, Fishman & Grauer PLLC

[57] ABSTRACT

In a method of monitoring an output module to which a number of inductive loads are connected and in which the current flowing through these inductive loads is regulated by clocked driving of the output stages, the current created in the blocked phases of the output stages by the inductively stored energy is partially or temporarily conducted across a common current measuring device and evaluated for testing the output stages, including the inductive loads.

16 Claims, 6 Drawing Sheets

PROCESS AND CIRCUITRY FOR MONITORING A CONTROL CIRCUIT

BACKGROUND OF THE INVENTION

The invention concerns a method of monitoring a control circuit which has a number of output stages switching inductive loads, where the current flowing through the inductive loads is regulated by clocked driving of the output stages, and where the current created by the decay of the power stored in the inductive loads during the blocking phases of the output stages is conducted over a current path that is parallel to the load and contains a switch. Circuit arrangements for carrying out this method are also within the scope of the invention.

There are already known automotive control systems, such as anti-skid systems (ABS), drive slip control systems (ASR), driving stability regulators (DSR, ASMS), etc., containing control circuits to which are connected a large number of electrically or electromagnetically activated hydraulic valves. The functions of such control systems are critical for the safety of the motor vehicle, because in an emergency situation or when brakes are applied in a panic, the brake pressure is reduced by an ABS system, for example, to prevent the wheels from locking up, and therefore the brake function is temporarily reduced or canceled. Such systems which are critical for safety and their hydraulic and electrical components, including the control circuits discussed here, must of course be monitored continuously for proper functioning.

Such electrically driven hydraulic valves are inductive loads for the associated control circuit. The control circuits have output stages in the form of driver transistors and similar devices which can be switched on and off thus determine the flow of current through the hydraulic valve. When the driver transistor is blocked, the energy stored in the inductive load, i.e., in the coil of the hydraulic valve, tends to maintain the coil current, and therefore, to limit the cut-off voltage, a path for the cut-off current or free-wheeling current must be created parallel to the coil.

By clocked driving of the driver transistor or the output stages and by utilizing the free-wheeling current, the average current flowing when the valve is switched on can be limited to a preset value, when the cycle duration and cycle interruption are appropriately coordinated with each other. In other words, by clocked driving of the driver transistor, closing of the switch in the current arm parallel to the inductive load during the blocking interval of the driver transistor, and modulating the pulse/pause ratio of the drive cycle, a preset average current can be set. The response thresholds for switching the valve and the subsequent holding current can assume different values; reducing the valve current after valve response or switching leads to considerable energy savings. However, such systems require careful monitoring of adequate current values of the response current as well as the holding current in order to promptly detect, with the required certainty, both errors and "creeping" defects due to changes in reference voltage values, etc.

The object of the invention is to develop a method with which functioning and proper operation, maintenance of various current or threshold values can be monitored with a high degree of reliability in such control circuits.

SUMMARY OF THE INVENTION

It has been found that this object can be accomplished by the method according to the invention with the distinguishing feature that, for a monitoring method for a control circuit of the type described initially, the cut-off current or free-wheeling current induced by the power drop in the inductive loads, namely in the coils of the hydraulic valves, is rerouted at least partially or for a specific period of time to a separate current measuring device and evaluated for the purpose of testing the output stage, including the load. In particular, it is provided that the individual output stages are to be checked or tested by rerouting the given cut-off current and free-wheeling current in succession to a common current measuring device.

For a control circuit to which electrically operated hydraulic valves are connected as inductive loads, separate measurement operations are performed according to an advantageous embodiment of the invention to determine whether the preset current values, e.g., valve response current and valve holding current are being maintained.

The sequence in checking and testing the individual output stages and current threshold values is advantageously determined with the help of a supplementary circuit, with the checking and testing being repeated only after all output stages and all current threshold values have been checked and tested. Of course, it is also possible to give priority in the test process to specific output stages and threshold values that are especially important for functional reliability.

Other features, advantages, and possible applications of the invention are derived from the following explanations of details and embodiments of the invention, with reference to the accompanying drawings.

DETAILED DESCRIPTION OF THE DRAWINGS

Figure 1:
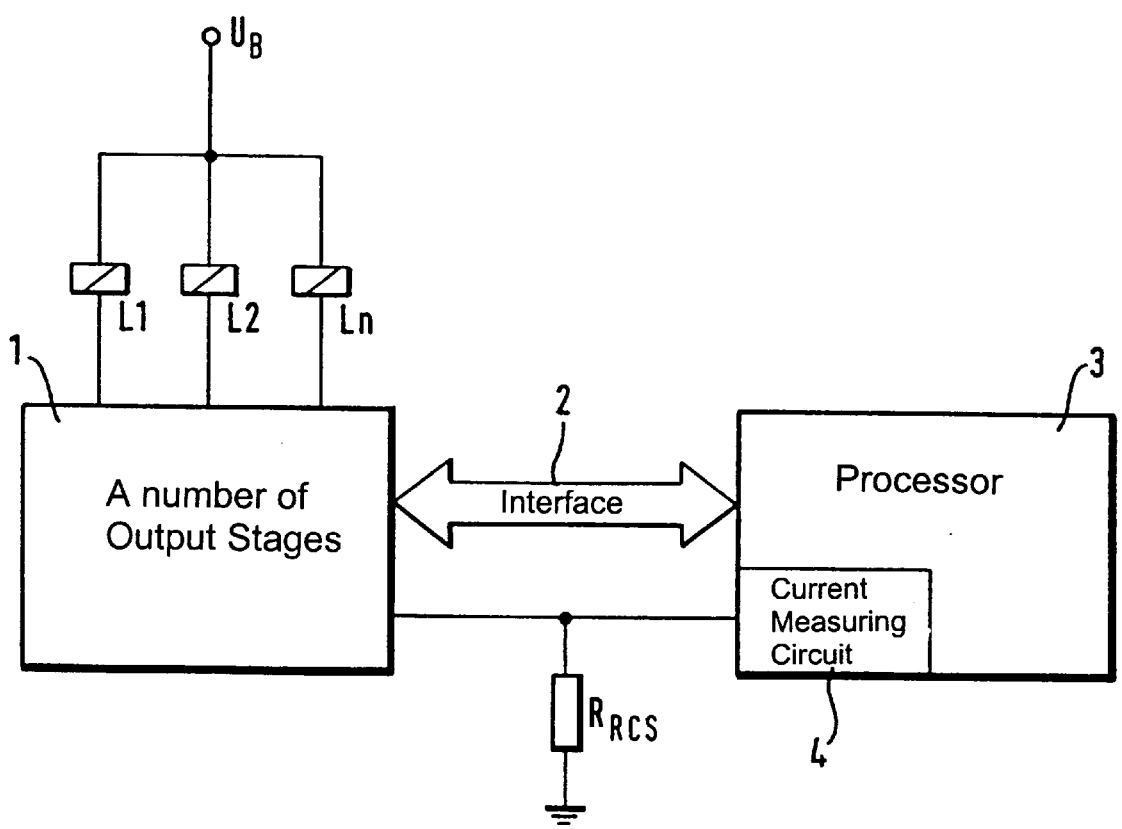
FIG. 1: A diagram of a control system with a control circuit of the type discussed here.

In the embodiment of the invention according to FIG. 1, an output module 1 is connected via an interface 2 to a processor or microprocessor. Output module 1 contains a large number of output stages (not shown) in the form of driver transistors or similar devices that drive the inductive loads, e.g., the windings or coils of hydraulic valves L1, L2, Ln, etc. The positive pole of a supply voltage $U_B$ is represented symbolically in FIG. 1, and here, in the case of a motor vehicle, this indicates a terminal leading to the vehicle's battery.

The circuit according to FIG. 1 additionally has a current measuring circuit 4, which is shown as a component of processor 3, but may also be designed as a separate module. This current measuring circuit 4 measures the voltage drop across an ohmic measuring shunt $R_{RCS}$. In the manner described in detail below, the currents to be measured or monitored are conducted to measuring shunt $R_{RCS}$ with the help of a monitoring circuit belonging to output module 1.

The magnitude of the voltage drop across the measuring shunt is then detected and evaluated with the help of current measuring device 4 (or a voltage measuring device).

Figure 2:
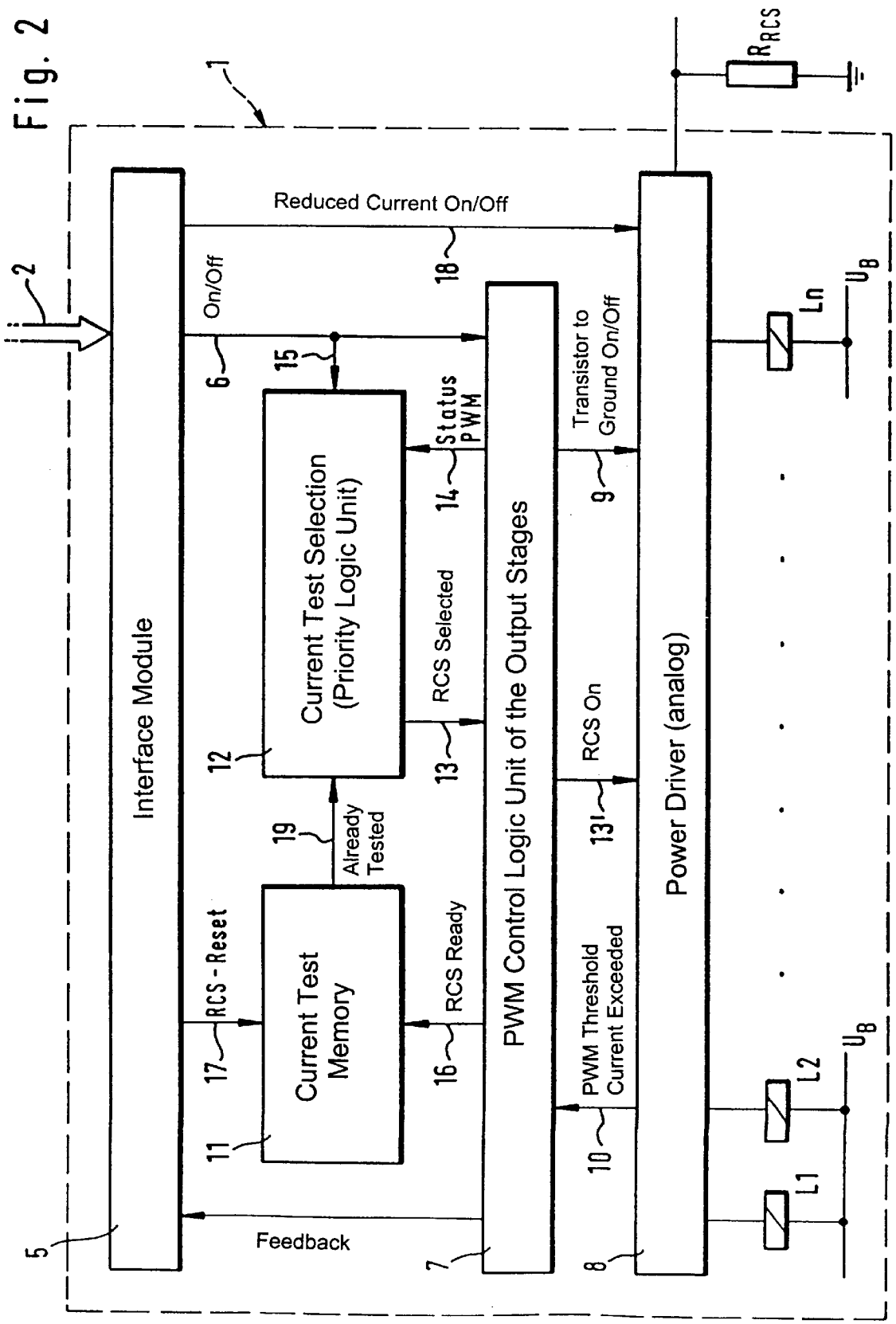
FIG. 2: A block diagram of an output module for the control system according to FIG. 1.

Details of output module 1 are shown in FIG. 2.

Interface module 5 receives over interface 2 the information transmitted by processor 3 (see FIG. 1) for switching the inductive loads or hydraulic valves L1, L2, Ln on and off. A signal line 6 inside the output module 1 conveys the connect and disconnect commands to a control logic unit 7. In the embodiment shown, there is a circuit with clocked PWM (pulse-width modulated) control of power drivers or power transistors which are accommodated in circuit block 8 and form the actual output stages of output module 1. Inductive loads or hydraulic valves L1, L2, Ln are then controlled directly by power drivers in module 8.

From PWM control logic unit 7, a signal line or a signal bus 9 over which connect and disconnect commands are transmitted leads to power driver block 8. A feedback signal to control logic unit 7 travels over line 10 from power driver block 8 to control logic unit 7 as soon as a PWM threshold current, i.e., a preset threshold value of the field current (which increases after a coil or inductive load has been activated) is attained or exceeded. As a result, the power driver or power transistor involved is blocked in the known manner, and the cut-off current or free-wheeling current is conducted over a current path that is parallel to the inductive load and contains a switch or switch transistor. After a certain period of time, the power driver is turned on again to maintain the field current flowing through the coil of the hydraulic valve at an average level. This type of regulated control of inductive loads by clocked switching of the power driver makes it possible to limit the field current to a level that is just adequate and leads to considerable energy savings.

Output stage module 1 shown in FIG. 2 contains a current test memory 11 and a current test selector circuit or priority logic unit 12. Selector circuit 12 determines which output stage and which current threshold shall be checked or tested next. The selected output stage is connected over a signal line 13, 13' to the current measuring device consisting of measuring shunt RRcs and current measuring circuit 4. In this process, selector circuit 12 takes into account the status of the PWM drive; therefore, selector circuit 12 receives information about PWM status over line 14. Control of the valves triggered by the controller also plays a role, which is why selector circuit 12 is connected over line 15 to line 6 and thus to interface module 5.

Current test memory 11 determines which output stage and which current threshold value has already been checked or tested. The memory obtains the necessary information from control logic unit 7 over line 16. Resetting of memory 11 and hence initialization of the renewed checking and testing procedure are triggered over line 17 via interface module 5 at specific points in time, e.g., after all analyses and test processes are completed, or after completion of the most important processes.

An essential measure according to one embodiment of the method according to the invention consists of the fact that in addition to monitoring the current values or attainment of the preset current threshold values in controlling hydraulic valves L1, L2, Ln, current tests with reduced valve control currents are also performed. For this purpose, the inductive loads or the valves are driven for specific periods of time or with limited current values which are below the valve response time and which lead to valve currents significantly lower than the valve currents required in normal operation. These reduced or fractional currents serve only for testing the output module and the reaction of the individual stages to the control signals.

For this test method a current on/off command is given over a line 18 leading from interface module 5 to power drivers 8, where the valve current increases only to a preset test threshold value, and then it is reduced in the same ratio as in normal operation and next is increased again. The entire operation takes place in less than the valve response time. Each output stage and each current threshold is tested in this way. If the hydraulic valves are driven with different response and holding currents, this is also taken into account in the test.

The cut-off current or free-wheeling current is conducted temporarily to measuring shunt RRCs (see FIG. 1), by power driver module 8, during the checking and testing processes, so that the voltage drop across measuring shunt RROS can be evaluated in the current measuring circuit.

Interface module 5 according to FIG. 2 thus receives the information sent by processor 3 via interface 2 for switching inductive loads L1, L2 and Ln on and off. Simultaneously, if current tests are to be performed, initialization of the current test takes place through the RCS reset; this initialization takes place across interface 2 and module 5. After this initialization, the current tests run automatically, with the precondition that the valves are switched on. The RCS reset sets all the registers of current test memory 11 to zero. In the current test memory, a determination is made of which current test has already been performed. During performance of a current test or after a current test is concluded, the current test memory obtains over line 16 information about which current test has taken place. It is possible to perform current tests of the same type several times or only once after a current test initialization.

Priority logic unit 12 processes information (conveyed to priority logic unit 12 over line 19) about current tests already performed or outstanding as well as information about the status of the output stage current regulation, which is made available by the PWM control logic unit over line 14. With the help of this information, priority logic unit 12 selects the next current test to be performed. Every possible current test has an assigned priority. The current tests for which the shortest period of time is available during a control cycle of the output module or for modules whose functions are most important for the functional reliability of output module 1 are assigned the highest priority. If a current test is selected, then, in the embodiment described here, a specific period of time during the free-wheeling phase of the coil current after blocking of the output is selected as the test time and the test is performed. After the test is concluded, the memory is notified of which current test has been performed.

Figure 3:
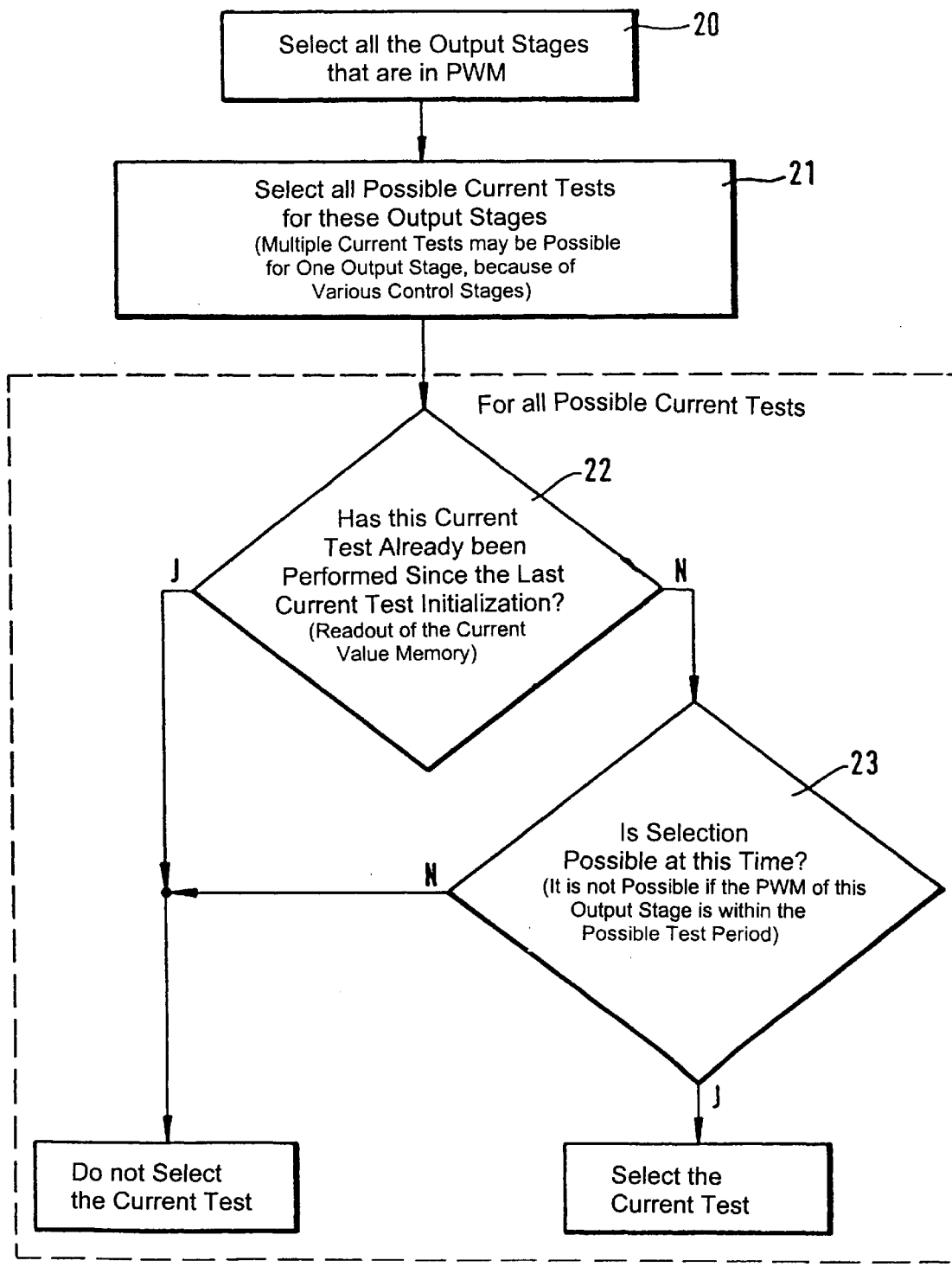
FIG. 3: A flow chart showing a step in selection of the current test.

The flow chart in FIG. 3 shows an example of the functioning or linkage of the information in current test selector circuit 12. First, all the output stages in the control system are included in step 20. Several current threshold values must be monitored and several current tests must be performed for each output stage (21). The decision (22) depends on whether or not a given current test has been performed since the last reset. If it has not, step 23 determines whether this as-yet-unperformed current test is possible at the given time.

Figure 4:
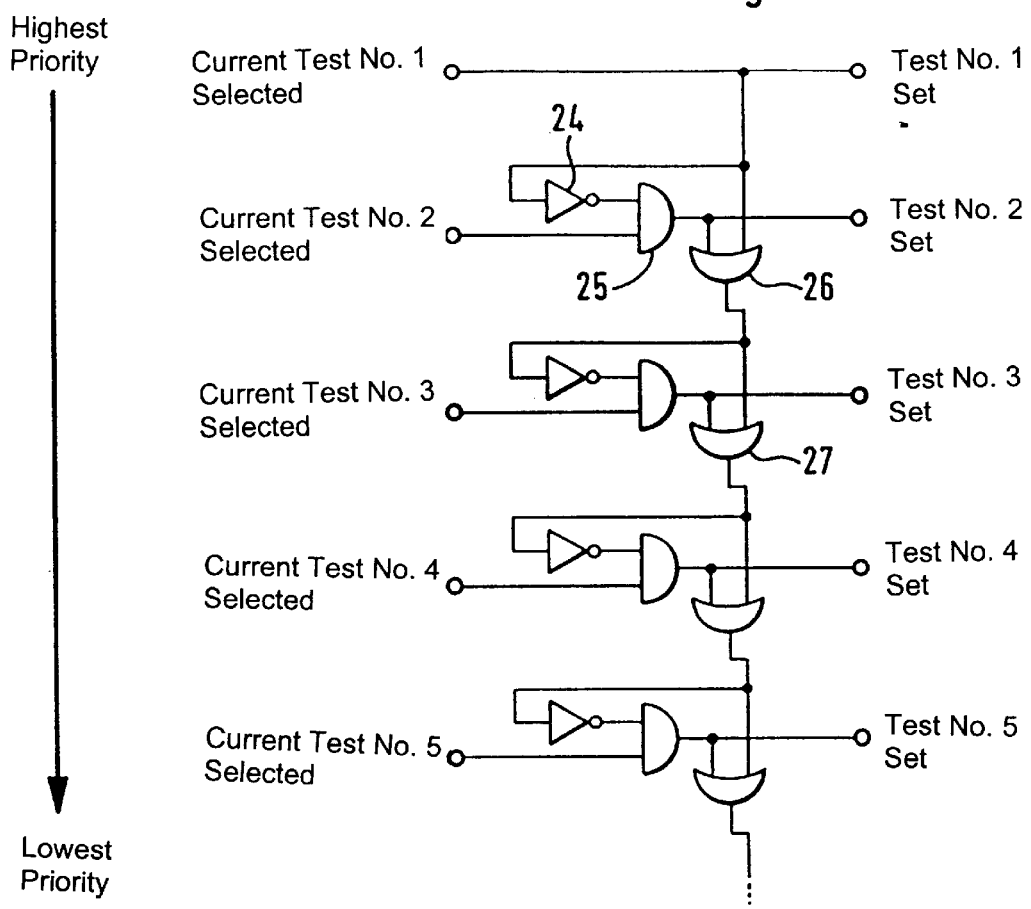
FIG. 4: An example of allocation of priorities.

Of the current tests selected by the decision process according to the flow chart in FIG. 3, the one with the highest priority is determined. FIG. 4 shows an example of a priority allocation or a logic circuit for definition of priority ranking. In the example shown, current test no. 1 has the highest priority and current test no. 5 has the lowest. If, for example, current test no. 1 is selected, 1 appears at test output no. 1. An inverter 24 and AND gate 25 ensure that the '0' is retained at test output no. 2, even when current test no. 2 is selected. With the help of an OR gate 26, a condition is ensured whereby all other test outputs remain at signal level '0' when current test no. 1 is selected.

If, in another example, current test no. 3 had been selected, this would have led to a '1' at test output no. 3, while the subsequent test outputs (no. 4 and no. 5) would be blocked in corresponding fashion.

Figure 5:
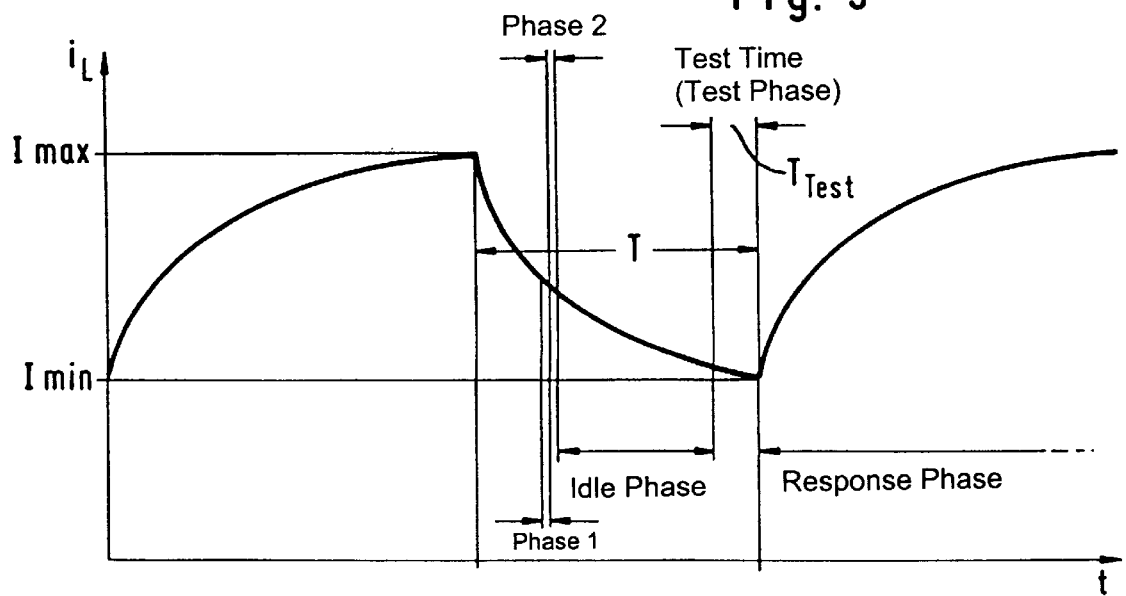
FIG. 5: A detail of the current curve with clocked driving of the output stages.

FIG. 5 shows the choice of the point in time or period of time, called the "test phase" here, during which the current to be measured is conducted across measuring shunt $R_{RCS}$ and the voltage drop across the measuring shunt is evaluated. This shows a detail of the curve of current I flowing through inductive load L1, L2, Ln with clocked driving of the output stage. As soon as the current $i_L$ reaches a predetermined maximum Imax—or after a certain period of time—the driver transistor of the output stage is blocked, whereupon as a result of the energy stored in the coil or in the inductance, a cut-off current or free-wheeling current is generated. After a specified period of time or after the current $i_L$ drops to a predetermined value Imin, the driver transistor of the output stage is again connected for transmission. This alternation is continued up to the disconnection of the respective hydraulic valve. In another embodiment (not described here in further detail), the field current is reduced to a holding current after the coil responds, and this holding current is then kept at an average level by the clock.

The current characteristic according to FIG. 5 shows, with driving of the hydraulic valve until the response value Imax is safely achieved and then a drop to Imin in the free-wheeling phase, the same proportions as for driving of this valve at a reduced test current at which the valve cannot respond. The current threshold values "Imax" and "Imin" for testing or analyzing the valve are much higher in normal operation than in test operation.

After selecting an output stage for a current test according to FIG. 3 in a phase 1 (see FIG. 5), the selected current test is transferred to a register and stored in a phase 2. In a subsequent idle phase, the current test determined during phase 2 remains stored. If the channel to be tested or the output stage to be tested is switched off during the idle phase, the selected test is discarded; a current test is selected anew with phase 1 as a function of PWM status and the test time. In the normal case, when the selected channel, like that in the example shown in FIG. 5, remains connected, the current test is performed at the end of the cut-off or free-wheeling phase; this test phase $T_{test}$ thus takes place directly before the renewed connection of the output transistor or driver. The duration of the freewheeling phase is definitely preset by the PWM logic unit, so that the time for beginning the test phase $T_{test}$ is also determined.

If the channel or the selected output stage in the test is switched off during the test phase $T_{test}$, the test is completed properly. In this case the test is evaluable.

In the reply phase shown in FIG. 5, the output stage modules output information via interface module 5 regarding which current test has been performed. For this response phase, either a fixed duration of several milliseconds is provided, or the response phase continues until the information is read out. After the response phase is ended, a new current test is selected again with phase 1—see FIG. 3.

Figure 6:
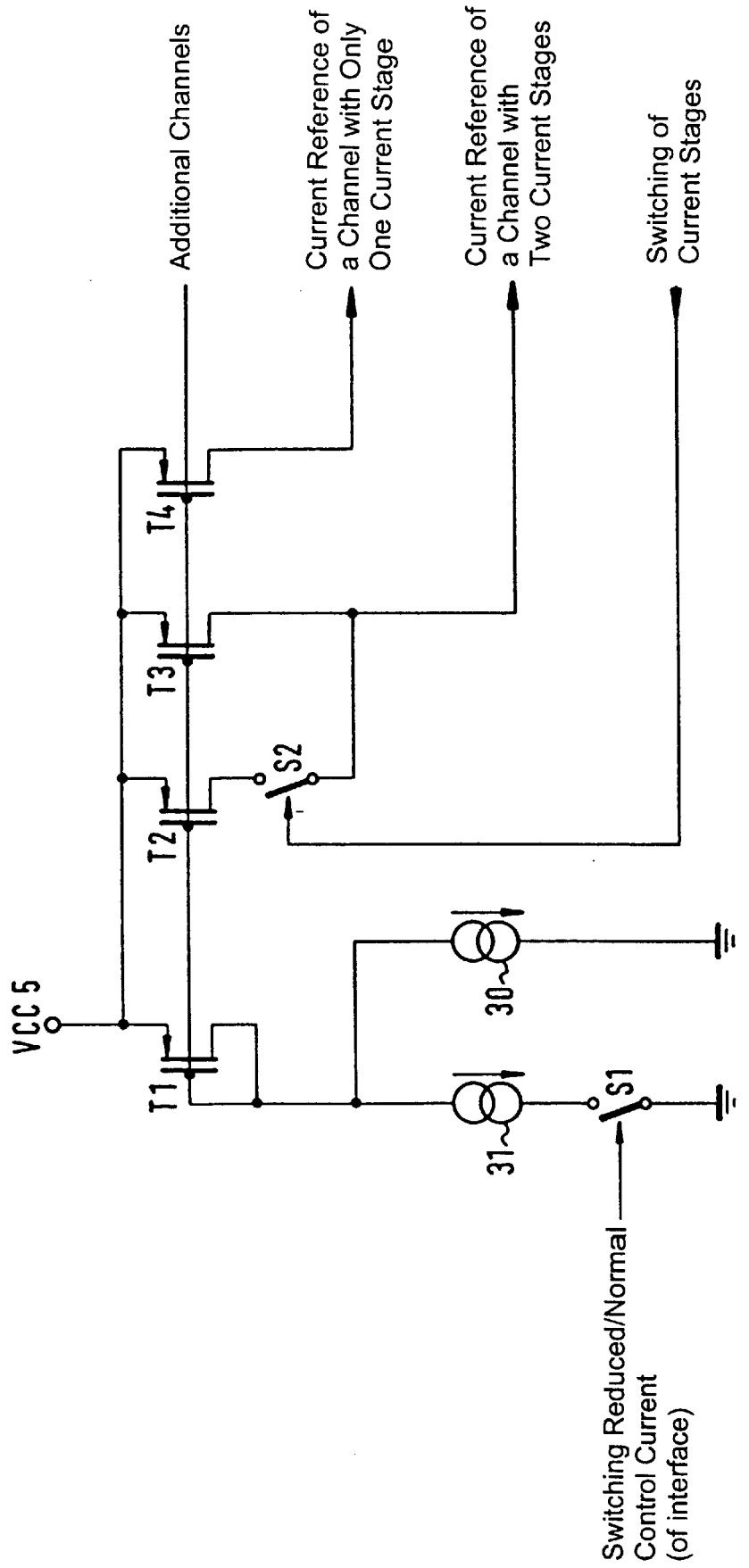
FIG. 6: A basic diagram of generation of current reference values.

FIG. 6 shows an example of a circuitry with the help of whose it is possible to monitor the PWM function and the functioning of the current test during stand-by operation of the output module, i.e., outside a control system. For example, this stand-by operation is in effect for an ABS controller during normal operation of the motor vehicle, as long as no ABS control is necessary. With this test in stand-by operation, full PWM functioning is monitored, i.e., controlled driving of the output stages, or by clocked rating of the output stages and the current test. Malfunctioning and defects are detected very early.

To perform these tests, the inductive loads are, as already mentioned, driven with a reduced control current. This control current causes no mechanical reactions of the inductive loads or the hydraulic valves; however, continuous current control is possible on the basis of these comparatively low test currents.

At the same time with the information on activation of the inductive loads, switching to a reduced control current is performed via the serial interface, e.g., by a special bit or a special bit combination. It is important here for the switching back to the normal operating current to be monitored. For this reason, according to a practical embodiment of the invention, current switching is performed at only one point in the output module. Then by means of an active test pulse with normal current on only one load element or valve, switching back from the test current to the normal current can be monitored. Since in this case only one switching element is available for switching over to the reduced current, the control current for all output stages and for all current control stages of the individual channels must be reduced by the same factor.

The output module is driven in stand-by operation as follows, according to FIG. 6:

After starting operation of the output module, e.g., by turning on the ignition of a motor vehicle, at least one output stage is switched on with a reduced control current. In this way, initialization of the current test takes place. The current value determined in the current test is compared in processor 3 (see FIG. 1) with the preset value for the reduced current. If the setpoint and the actual value do not match, there has been an error. A safety disconnect of the system is initiated.

By means of the measures described here, proper switching to a reduced control current, the functioning of the current control system and the current test are monitored.

Then, with the help of an active test pulse with a normal control current, i.e., with a current sufficient for response of the valves, the switch back from a reduced control current to normal control current is checked. For this purpose, with initialized current tests, at least one valve is switched on with a normal control current until the current test has been received. Processor 3 checks the received current value for agreement with the setpoint for normal control current. If the received current value is too low, then the switch back to normal control current is not functioning. A safety disconnection takes place. If the received current value is outside the tolerance, or if it fails to appear within a defined period of time, it is then assumed that either the current control or the current tests are not functioning at normal current. Therefore, this also results in a safety disconnect.

In the course of the next stand-by operation of output module 1, it is practical to perform current tests at a reduced control current, in order to constantly monitor for proper functioning of the current regulation system and the current tests and to switch off the system in the event of a fault.

Upon passage from stand-by operation to normal operation, switching back to the normal control current takes place.

FIG. 6 shows an example of generating the reference control currents for the output module described. With the help of a current source 30, a reduced control current is generated for the current tests, and by connecting the current to a current source 31, this current can be increased to the full normal control current by closing a switch S1. By current balancing with the help of transistors T1 to T4, the required reference values are generated. T3 produces a current reference value for one output stage or one valve that is driven with two current steps—a starting current value and a holding current value. As long as switch S2 is open, the lower current reference value is applicable; after closing switch S2, the higher current reference value is in effect. The current reference value for a channel or a hydraulic valve which requires only one reference value is obtained with transistor T4.

The current reference values generated with transistors T2, T3, and T4, as shown in FIG. 6, change in the same ratio when current sources 31 are switched on and off with the help of switch S1.

Figure 7:
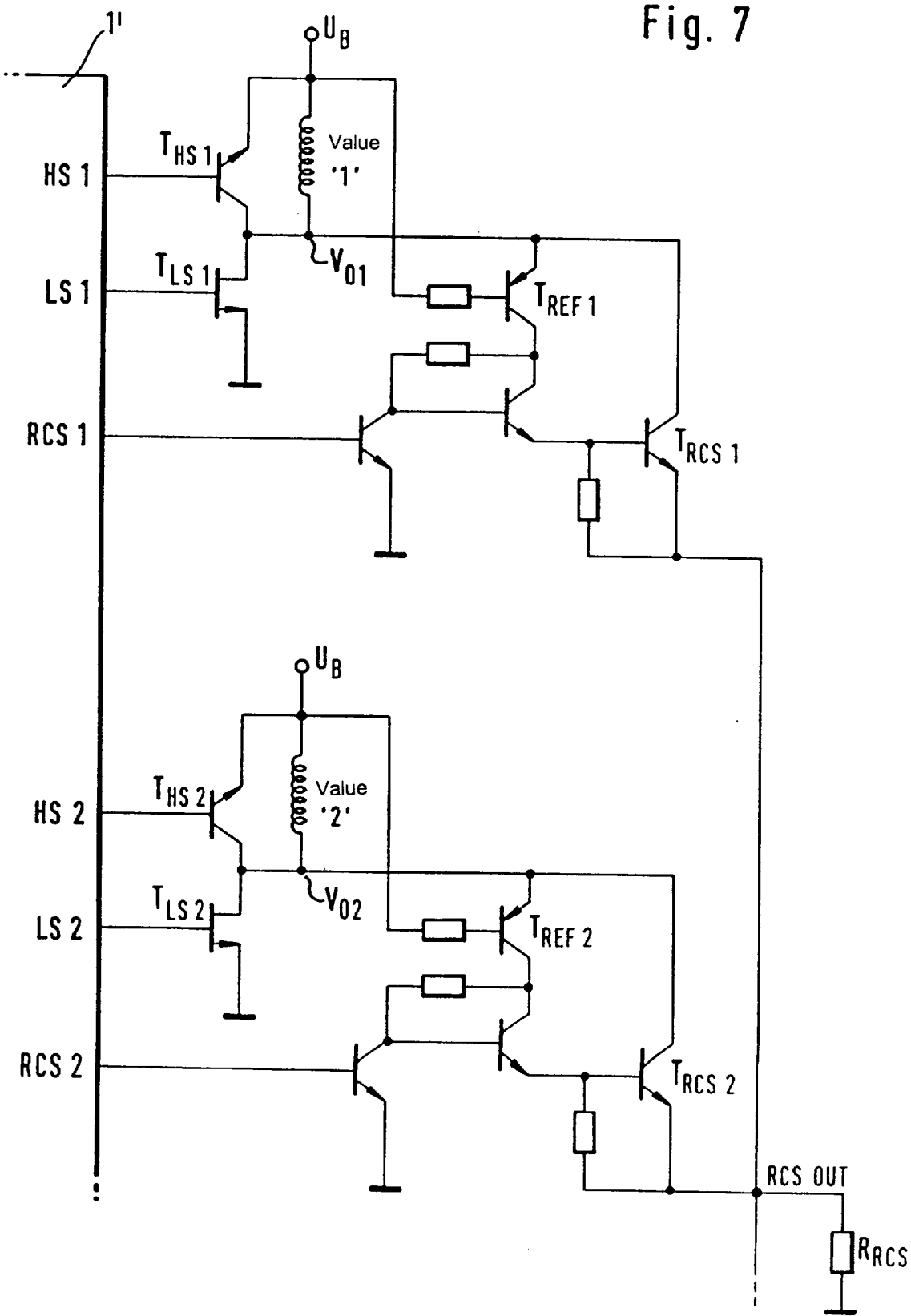
FIG. 7: An example of the connection of the common current measuring device to the power driver.

FIG. 7 shows an example of a circuit for connecting the common current measuring device with measuring shunt $R_{RCS}$ to an output module 1. Output module 1' differs from module 1 (FIGS. 1 and 2) only by the separately formed connection components, shown in FIG. 7. According to the method of the invention, the cut-off current or free-wheeling current which is induced by the drop in energy stored in the inductive load is rerouted to measuring shunt $R_{RCS}$ at intervals, i.e., during the measurement or test phase. Since according to the method of the invention, this measuring shunt is used in common by all output stages or valves, the current of all valve coils must be rerouted in sequence to the terminal of the precision measuring coil. The transistor circuit used for this purpose is shown in FIG. 7 for two valves. This circuit operates as follows.

Transistor $T_{RCS1}$ belonging to a valve '1' to be tested, or transistor $T_{RCS2}$ belonging to a second valve '2', is connected for rerouting the free-wheeling current. If the current test takes place, both transistors $T_{HS1(2)}$ and $T_{LS1(2)}$ are blocked. A transistor $T_{REF1(2)}$ first becomes conducting when and for as long as the voltage at nodal point $V_{O1(2)}$ is greater by a quantity $U_{BE}$ than voltage $U_B$. This measure ensures that the inductive load or valve '1' ('2') cannot also be supplied across measuring shunt $R_{RCS}$.

When the hydraulic valves are operated at different start-up and holding currents, it is necessary to ensure that both current thresholds are tested for maintenance of minimum values.

For each valve, as shown in FIG. 7, three connections are provided to the PWM control logic unit and to output module 1'. LS1(2) serves to switch on inductive load HS1(2), to drive a transistor $T_{HS1(2)}$ in the current path parallel to the inductive load or valve coil, and RCS1(2) activates current monitoring or current testing by measuring shunt $R_{RCS}$.

What is claimed is:

1. A method of monitoring a control circuit having a number of output stages switching inductive loads, wherein the current flowing through the inductive loads is regulated by clocked driving of the output stages, and a free-wheeling current, created during free-wheeling phases upon blockage of the output stages by a drop in energy stored in the inductive loads, is conducted over a current path arranged parallel to the inductive loads and containing a switch; wherein the free-wheeling current created by the energy drop in the inductive loads is at least partially or temporarily routed via a switching element to a current measuring device and evaluated for the purpose of testing one of the output stages and the inductive loads wherein the individual output stages are tested in sequence by routing the free-wheeling current to a common current measuring device.

2. The method according to claim 1, wherein, for monitoring a control circuit in which electrically operated hydraulic valves are provided as inductive loads, an adherence to preset current values is checked in separate measurement operations.

3. The method according to claim 2, wherein the adherence to minimum values of a valve start-up current and a holding current is monitored.

4. The method according to claim 2, herein the output stages, including the hydraulic valves, are tested by driving the given output stage for a preset period of time which is less than a valve response time or than a time during which a valve current is created that is below a valve response value, and evaluating the free-wheeling current created by the energy drop in the inductive loads.

5. The method according to claim 4, wherein in the test phase, the hydraulic valves are monitored for maintaining a regulated valve test current which is set at a specified fractional value of the valve response value or of the valve holding current.

6. The method according to claim 1, wherein for testing the valve response value, the free-wheeling current created by the energy drop in the inductive loads is routed to the current measuring device immediately after the valve response value is maintained for a preselected period of time.

7. The method according to claim 1, wherein for monitoring the valve holding current, the free-wheeling current created by the energy drop in the inductive loads, at the end of the free-wheeling phase of the output stage or at the end of a clock pause during clocked driving of the output stage, is routed to the current measuring device.

8. The method according to claim 1, wherein a sequence of checking and testing the individual output stages and the various current threshold values is determined with the help of a supplementary circuit, and only after checking and testing at least specific output stages and current threshold values, the checking process is repeated.

9. The method according to claim 8, wherein the sequence of checking is preset by a priority logic unit.

10. The method according to claim 9, wherein a priority assignment is selected as a function of an expected frequency of a drive of a given valve.

11. The method according to claim 9, wherein a priority assignment is selected as a function of the importance of a selected output stage for the operation of the control circuit.

12. A circuitry for performing a method of monitoring a control circuit including an output module having output stages switching inductive loads; the output module having current paths that are parallel to the inductive loads and comprise switches, and across the current paths, upon blockage of the output stages, a free-wheeling current is induced as a result of energy stored in the inductive loads, and wherein the output module is coupled to a current measuring device, and for testing the output module, including the inductive loads, the free-wheeling current induced due to the energy stored in the inductive loads is at least partially or temporarily routed to the current measuring device and wherein the switches are in the circuit paths that are parallel to the inductive loads, and a plurality of switching elements for switching on the current measuring device are transistors, and for said routing of the free-wheeling current the switches located in the parallel current paths are blocked, and the transistor leading to the current measuring device is driven at the same time.

13. The circuitry according to claim 12, wherein the current measuring device contains an ohmic measuring shunt across which a voltage higher than the supply voltage of the control circuit can drop in a test phase.

14. The circuitry according to claim 13, wherein means are provided to monitor whether this voltage drop across the measuring shunt remains within upper and lower limit values.

15. The circuitry according to claim 12, wherein, for checking and testing the output module, a common current measuring device is provided which contains a measuring shunt that dissipates the induced free-wheeling current to ground and is connected across a transistor circuit for testing the output stage, and said transistor circuit is designed to be conducting only when, during the blocking of the output stage, the potential at an associated valve coil increases to a magnitude above a potential predetermined by a supply voltage.

16. The circuitry according to claim 12, wherein a supplementary circuit is provided with a priority logic unit which is capable of determining the sequence of checking and testing operations of the individual output stages, of determining the time of the checking and testing operations, and of controlling these operations.

* * * * *